US012446270B2

(12) United States Patent
Hebert et al.

(10) Patent No.: US 12,446,270 B2
(45) Date of Patent: Oct. 14, 2025

(54) JUNCTION FIELD-EFFECT TRANSISTORS IMPLEMENTED IN A WIDE BANDGAP SEMICONDUCTOR MATERIAL

(71) Applicant: GlobalFoundries U.S. Inc., Malta, NY (US)

(72) Inventors: Francois Hebert, San Mateo, CA (US); James A. Cooper, Santa Fe, NM (US)

(73) Assignee: GlobalFoundries U.S. Inc., Malta, NY (US)

( * ) Notice: Subject to any disclaimer, the term of this patent is extended or adjusted under 35 U.S.C. 154(b) by 507 days.

(21) Appl. No.: 17/892,205

(22) Filed: Aug. 22, 2022

(65) Prior Publication Data

US 2024/0063309 A1    Feb. 22, 2024

(51) Int. Cl.
*H10D 30/83* (2025.01)
*H10D 12/01* (2025.01)
*H10D 62/832* (2025.01)

(52) U.S. Cl.
CPC ........... *H10D 30/83* (2025.01); *H10D 12/031* (2025.01); *H10D 62/8325* (2025.01)

(58) Field of Classification Search
CPC ............. H10D 30/0245; H10D 30/051; H10D 30/0515; H10D 30/0516; H10D 30/83; H10D 30/831; H10D 30/665; H10D 30/668; H10D 30/6757; H10D 12/031; H10D 12/032; H10D 12/038; H10D 62/054;

(Continued)

(56) References Cited

U.S. PATENT DOCUMENTS 4,067,036 A * 1/1978 Yoshida ............. H01L 29/8083
257/E29.313
5,702,977 A    12/1997 Jang et al.
(Continued)

FOREIGN PATENT DOCUMENTS

DE       102014107172 A1    12/2014

OTHER PUBLICATIONS

C. Zhao, Y. Jiang and S. Liu, "Polysilicon-Al Based Ohmic Contact on p-Type 3C-SiC Film Grown on Silicon Substrate," 2006 8th International Conference on Solid-State and Integrated Circuit Technology Proceedings, 2006, pp. 938-940, doi: 10.1109/ICSICT. 2006.306600.

(Continued)

*Primary Examiner* — Natalia A Gondarenko
(74) *Attorney, Agent, or Firm* — Thompson Hine LLP; Francois Pagette

(57) ABSTRACT

Structures for a junction field-effect transistor and methods of forming such structures. The structure comprises a semiconductor substrate including a trench, and a source including a doped region in the semiconductor substrate adjacent to the trench. The doped region and the semiconductor substrate have the same conductivity type. The doped region has a first boundary adjacent to a surface of the semiconductor substrate and a second boundary spaced in depth from the first boundary. The structure further comprises a gate structure including a conductor layer inside the trench and a dielectric layer inside the trench. The first conductor layer has a surface positioned between the first boundary of the doped region and the second boundary of the doped region, and the dielectric layer is positioned on the surface of the conductor layer.

19 Claims, 10 Drawing Sheets

(58) Field of Classification Search
CPC .. H10D 62/058; H10D 62/105; H10D 62/142; H10D 62/149; H10D 62/343; H10D 62/351; H10D 62/357; H10D 62/8325; H10D 84/957; H10D 84/966; H10D 64/20; H10D 64/251; H10D 64/252; H10D 64/2523; H10D 64/2527; H10D 64/258; H10D 64/311; H10D 64/513; H10D 64/517; H10D 64/60; H10D 64/605; H10D 64/675; H10D 64/68; H10H 29/853; H10H 29/8581
USPC .......... 257/77, 330, 328, 329, 284; 438/259, 438/589
See application file for complete search history.

(56) References Cited

U.S. PATENT DOCUMENTS

| | | | |
|---|---|---|---|
| 7,479,672 B2 | 1/2009 | Zhao | |
| 7,719,080 B2 | 5/2010 | Zhang | |
| 8,860,098 B2 | 10/2014 | Bhalla et al. | |
| 9,209,318 B2 | 12/2015 | Esteve et al. | |
| 10,367,098 B2 | 7/2019 | Li et al. | |
| 10,396,215 B2 | 8/2019 | Bhalla et al. | |
| 2005/0230745 A1* | 10/2005 | Fatemizadeh | H01L 29/1066 257/E29.313 |
| 2007/0029573 A1* | 2/2007 | Cheng | H10D 30/831 257/E29.313 |
| 2009/0065814 A1* | 3/2009 | Bhalla | H01L 29/1095 257/230 |
| 2011/0220917 A1* | 9/2011 | Hayashi | H10D 12/031 257/E21.24 |
| 2022/0093791 A1* | 3/2022 | Van Brunt | H01L 29/7802 |
| 2022/0140093 A1* | 5/2022 | Mayol | H10D 64/117 257/288 |
| 2024/0055513 A1* | 2/2024 | Pala | H01L 29/0623 |

OTHER PUBLICATIONS

T. Ishikawa, Y. Tanaka, T. Yatsuo and K. Yano, "SiC power devices for HEV/EV and a novel SiC vertical JFET," 2014 IEEE International Electron Devices Meeting, 2014, pp. 2.2.1-2.2.4, doi: 10.1109/IEDM.2014.7046964.

A. Bhalla, X. Li, P. Alexandrov and J. C. Dries, "The outlook for SiC vertical JFET technology," The 1st IEEE Workshop on Wide Bandgap Power Devices and Applications, 2013, pp. 40-43, doi: 10.1109/WiPDA.2013.6695558.

German Patent and Trademark Office; Office Action issued in German Patent Application No. 102023119442.9 on Apr. 3, 2025; 14 pages.

* cited by examiner

JUNCTION FIELD-EFFECT TRANSISTORS IMPLEMENTED IN A WIDE BANDGAP SEMICONDUCTOR MATERIAL

BACKGROUND

The disclosure relates to semiconductor devices and integrated circuit manufacture and, more specifically, to structures for a junction field-effect transistor and methods of forming such structures.

Wide bandgap semiconductors, such as silicon carbide, may be used in high-power applications and/or high-temperature applications. Silicon carbide is well suited for power switching because of advantageous properties, such as a high saturated drift velocity, a high critical field strength, an exceptional thermal conductivity, and a significant mechanical strength. A junction field-effect transistor is a type of gate-voltage-controlled power switching device that uses p-n junction depletion regions as a current control mechanism. A junction field-effect transistor may leverage the favorable properties of a silicon carbide substrate to enable, for example, power converters, motor inverters, and motor drivers that are characterized by high reliability and high efficiency.

Improved structures for a junction field-effect transistor and methods of forming such structures are needed.

SUMMARY

In an embodiment of the invention, a structure for a junction field-effect transistor is provided. The structure comprises a semiconductor substrate including a trench, and a source including a doped region in the semiconductor substrate adjacent to the trench. The doped region and the semiconductor substrate have the same conductivity type. The doped region has a first boundary adjacent to a surface of the semiconductor substrate and a second boundary spaced in depth from the first boundary. The structure further comprises a gate structure including a conductor layer inside the trench and a dielectric layer inside the trench. The conductor layer has a surface positioned between the first boundary of the doped region and the second boundary of the doped region, and the dielectric layer is positioned on the surface of the conductor layer.

In an embodiment of the invention, a method of forming a structure for a junction field-effect transistor is provided. The method comprises forming a trench in a semiconductor substrate, and forming a doped region of a source in the semiconductor substrate adjacent to the trench. The semiconductor substrate and the doped region have the same conductivity type. The doped region has a first boundary adjacent to a surface of the semiconductor substrate and a second boundary spaced in depth from the first boundary. The method further comprises forming a gate structure including a conductor layer inside the trench and a dielectric layer inside the trench. The conductor layer has a surface positioned between the first boundary of the doped region and the second boundary of the doped region, and the dielectric layer is positioned on the surface of the conductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
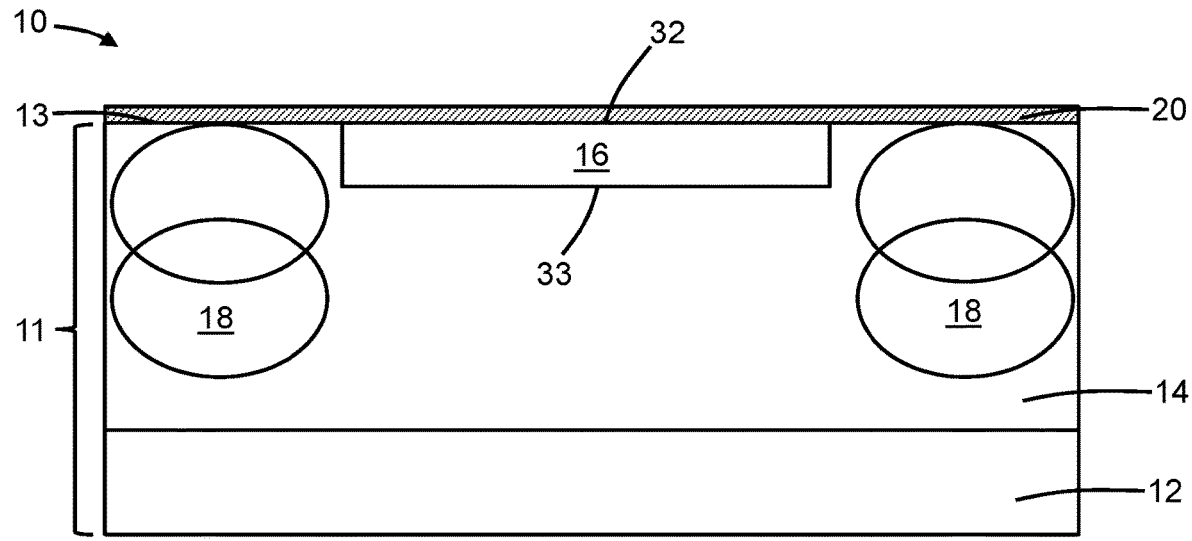
FIGS. 1-7 are cross-sectional views of a structure at successive fabrication stages of a processing method in accordance with embodiments of the invention.

With reference to FIG. 1 and in accordance with embodiments of the invention, a structure 10 for a junction field-effect transistor may be formed using a semiconductor substrate 11 that includes a bulk substrate 12 and a semiconductor layer 14 formed on the bulk substrate 12. In an embodiment, the semiconductor substrate 11 may be comprised of silicon carbide. In an embodiment, the semiconductor substrate 11 may be comprised of silicon carbide that is doped to have n-type electrical conductivity. In an embodiment, the bulk substrate 12 and the semiconductor layer 14 may be comprised of silicon carbide that is doped to have n-type electrical conductivity with the bulk substrate 12 having a higher dopant concentration and a lower electrical resistivity than the semiconductor layer 14. In an embodiment, the bulk substrate 12 may provide a drain of the junction field-effect transistor, and the semiconductor layer 14 may define a drift region of the junction field-effect transistor.

A doped region 16 may be formed in the semiconductor layer 14 adjacent to a top surface 13 of the semiconductor substrate 11. The doped region 16 has the same conductivity type as the semiconductor layer 14 but at a higher dopant concentration. The doped region 16 has an upper boundary 32 that may be coplanar or substantially planar with the top surface 13 of the semiconductor substrate 11 and a lower boundary 33 that is spaced in depth from the upper boundary 32. The lower boundary 33 of the doped region 16 defines an interface with the underlying semiconductor material of the semiconductor layer 14 across which the dopant concentration experiences a significant change. In an embodiment, the dopant concentration may experience an abrupt change at the lower boundary 33 of the doped region 16. The doped region 16 may define a source of the junction field-effect transistor.

The doped region 16 may be formed by introducing a dopant of a given conductivity type by, for example, ion implantation into the semiconductor layer 14. An implantation mask may be formed to define a selected area on a top surface 13 of the semiconductor substrate 11 that is exposed for the implantation of ions. The implantation mask may include a hardmask that is applied and patterned to form an opening exposing the selected area on the top surface 13 of the semiconductor substrate 11 and determining, at least in part, the location and horizontal dimensions of the doped region 16. The implantation mask has a thickness and stopping power sufficient to block the implantation of ions in masked areas. The implantation conditions (e.g., ion species, dose, kinetic energy, substrate temperature) may be selected to tune the electrical and physical characteristics of the doped region 16. In an embodiment, the doped region 16 may be doped with a concentration of an n-type dopant (e.g., nitrogen or phosphorus) to provide n-type electrical conductivity. In an embodiment, the doped region 16 may be doped with a higher concentration of the n-type dopant than the semiconductor layer 14.

Sets of doped regions 18 may be formed in the semiconductor layer 14. The doped regions 18 have an opposite conductivity type from the semiconductor layer 14. The doped region 16 may be positioned in a lateral direction between the different sets of doped regions 18. The doped regions 18 may be formed by introducing a dopant of a given conductivity type by, for example, ion implantation into the semiconductor layer 14. A patterned implantation mask may be formed to define selected areas on the top surface 13 of the semiconductor substrate 11 that are exposed for the implantation of ions. The implantation mask may include a hardmask that is applied and patterned to form openings exposing the selected areas on the top surface 13 of the semiconductor substrate 11 and determining, at least in part, the location and horizontal dimensions of the doped regions 18. The implantation mask has a thickness and stopping power sufficient to block the implantation of ions in masked areas. The implantation conditions (e.g., ion species, dose, kinetic energy, substrate temperature) may be selected to tune the electrical and physical characteristics of the doped regions 18. In an embodiment, the doped regions 18 may be doped with a concentration of a p-type dopant (e.g., aluminum) to provide p-type electrical conductivity. The doped regions 18 may define junction termination extensions of the junction field-effect transistor.

In an embodiment, multiple implantations with different kinetic energies may be chained to form each set of the doped regions 18 such that the doped regions 18 in each set are stacked and partially overlap. In an embodiment, each set of doped regions 18 may have a width dimension W1 that alternates between a maximum width and a minimum width with increasing depth in the semiconductor layer 14 below the top surface 13.

In an embodiment, a layer 20 may be applied to portions of the top surface 13 of the semiconductor substrate 11 and, in particular, the layer 20 may be positioned on the top surface 13 over each of the doped regions 18. The layer 20 may be comprised of a material having a high melting point, such as aluminum nitride. In an alternative embodiment, the layer 20 may be omitted from the top surface 13.

Figure 2:
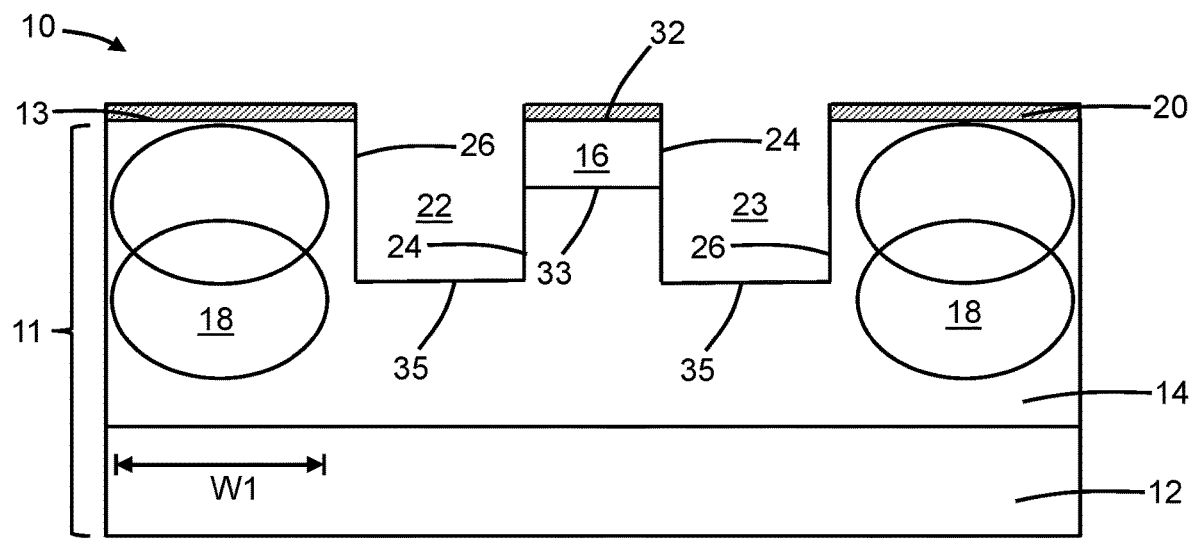

With reference to FIG. 2 in which like reference numerals refer to like features in FIG. 1 and at a subsequent fabrication stage, trenches 22, 23 are formed by lithography and etching processes that penetrate through the layer 20 and partially through the semiconductor layer 14. Each of the trenches 22, 23 has a sidewall 24 adjacent to the doped region 16, a trench bottom 35, and a sidewall 26 adjacent to one or the other of the doped regions 18. The trench bottom 35 of each of the trenches 22, 23 is positioned above the maximum depth of the doped regions 18 and below the maximum depth of the doped region 16 at the lower boundary 33. The doped region 16, which is truncated by trench formation, is positioned in a lateral direction between the trench 22 and the trench 23 and, more specifically, the doped region 16 is positioned in a lateral direction between the sidewall 24 of the trench 22 and the sidewall 24 of the trench 23.

Figure 3:
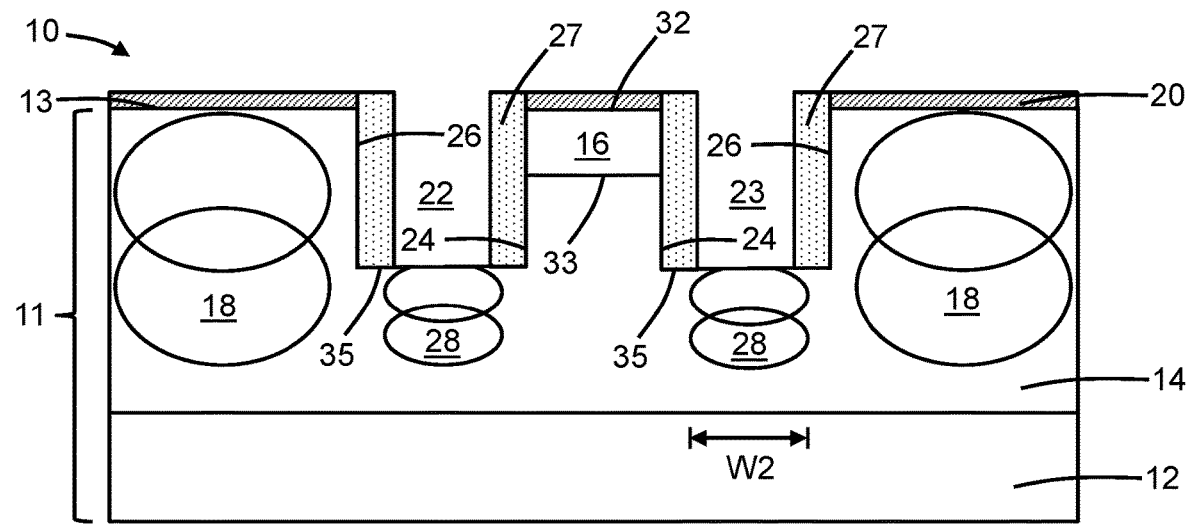

With reference to FIG. 3 in which like reference numerals refer to like features in FIG. 2 and at a subsequent fabrication stage, a set of doped regions 28 may be formed in the semiconductor layer 14 beneath the trench bottom 35 of each of the trenches 22, 23. The sets of doped regions 28 are positioned in a vertical direction between the trenches 22, 23 and the bulk substrate 12 operating as the drain of the junction field-effect transistor. The doped regions 28 have an opposite conductivity type from the semiconductor layer 14 and the doped region 16. The junction field-effect transistor has a channel length that is a function of the depth of the doped regions 28.

The doped regions 28 may be formed by introducing a dopant of a given conductivity type by, for example, ion implantation into the semiconductor layer 14. A patterned implantation mask may be formed to define selected areas on the top surface 13 of the semiconductor substrate 11 that are aligned with the trenches 22, 23 and exposed for the implantation of ions. The implantation mask may include a hardmask that is applied and patterned to form openings exposing the selected areas on the top surface 13 of the semiconductor substrate 11 and determining, at least in part, the location and horizontal dimensions of the doped regions 28. The implantation mask has a thickness and stopping power sufficient to block the implantation of ions in masked areas. The implantation conditions (e.g., ion species, dose, kinetic energy, substrate temperature) may be selected to tune the electrical and physical characteristics of the doped regions 28. In an embodiment, the doped regions 28 may be doped with a concentration of a p-type dopant (e.g., aluminum) to provide p-type electrical conductivity. The doped regions 28 may participate in defining gate structures of the junction field-effect transistor.

In an embodiment, multiple implantations with different kinetic energies may be chained to form each set of the doped regions 28 such that the doped regions 28 in each set are stacked and partially overlap. In an embodiment, each set of doped regions 28 may have a width dimension W2 that alternates between a maximum width and a minimum width with increasing depth in the semiconductor layer 14 below the trench bottom 35.

In an embodiment, the implantation forming the doped regions 28 may be performed with ion trajectories aligned in a vertical direction to limit the implantation of ions into the sidewalls 24, 26 of the trenches 22, 23. In an embodiment, the sidewalls 24, 26 may be temporarily covered during the formation of the doped regions 28 with spacers 27 that further limit or prevent implantation of ions into the semiconductor layer 14 at the sidewalls 24, 26 and that are removed following the formation of the doped region 28. In an alternative embodiment, the spacers 27 may be omitted such that the sidewalls 24, 26 are not temporarily covered during the implantation of ions forming the doped regions 28.

An anneal may be performed following the formation of the doped regions 28. The anneal may be performed with a removable carbon capping layer applied as a temporary coating and at a high temperature, such as a temperature in a range of 1600° C. to 1800° C. The capping layer may be comprised of, for example, burned photoresist or a deposited layer of carbon. The layer 20, which can withstand the high anneal temperature, may remain on the top surface 13 during the anneal. The layer 20 may enhance the surface protection during the anneal with self-alignment because the layer 20 is patterned when the trenches 22, 23 are formed.

Figure 4:
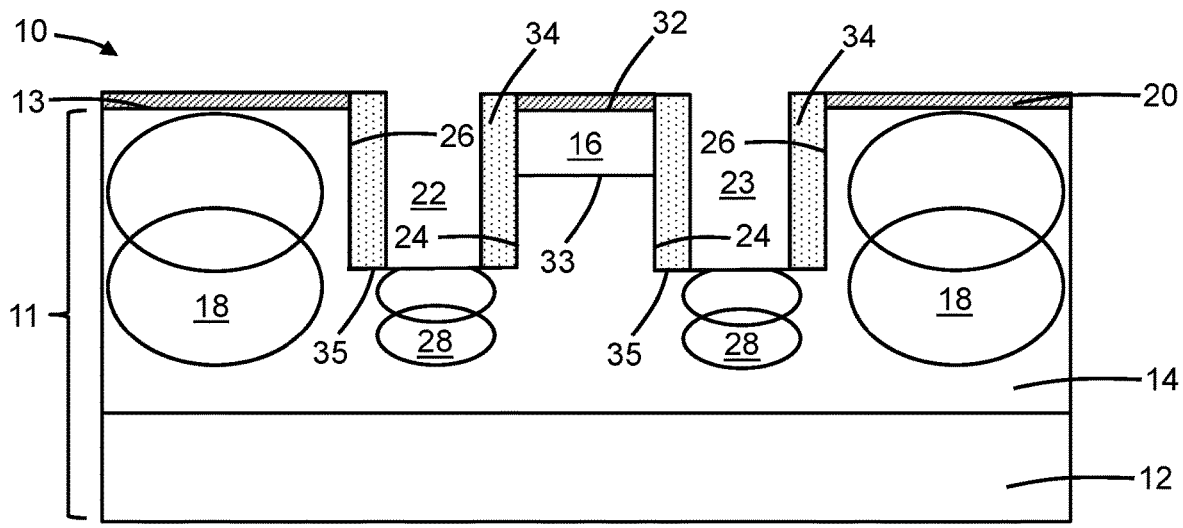

With reference to FIG. 4 in which like reference numerals refer to like features in FIG. 3 and at a subsequent fabrication stage, dielectric spacers 34 may be formed on the sidewalls 24, 26 of the trenches 22, 23. In an embodiment, the dielectric spacers 34 may be comprised of a dielectric material, such as silicon dioxide, that is an electrical insulator and that is conformally deposited and then anisotropically etched. The dielectric spacers 34 may extend from the top surface 13 of the semiconductor substrate 11 to the respective trench bottoms 35.

Figure 5:
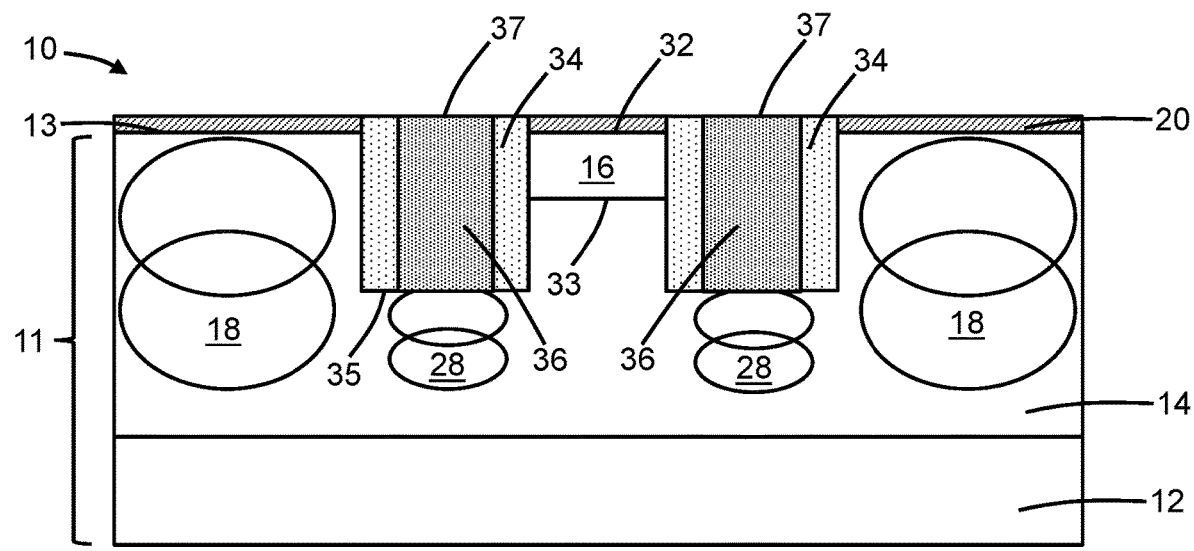

With reference to FIG. 5 in which like reference numerals refer to like features in FIG. 4 and at a subsequent fabrication stage, conductor layers 36 are formed inside the trenches 22, 23 (FIG. 4). In an embodiment, the conductor layers 36 may be comprised of a metal, such as tungsten or tungsten silicide. In an alternative embodiment, the conductor layers 36 may be comprised of a non-metal conductor, such as polysilicon that is heavily doped with a p-type dopant. An optional barrier liner may be applied inside the trenches 22, 23 before the conductor layers 36 are formed. The conductor layers 36 may be deposited and then polished and/or etched back such that each conductor layer 36 has a top surface 37 that is substantially planar with the top surface 13 of the semiconductor substrate 11. The doped region 16 is positioned in a lateral direction between the conductor layer 36 in the trench 22 and the conductor layer 36 in the trench 23 with the dielectric spacers 34 disposed between the doped region 16 and the conductor layers 36. The conductor layers 36 may be in direct contact with the semiconductor layer 14 at the trench bottoms 35.

Figure 6:
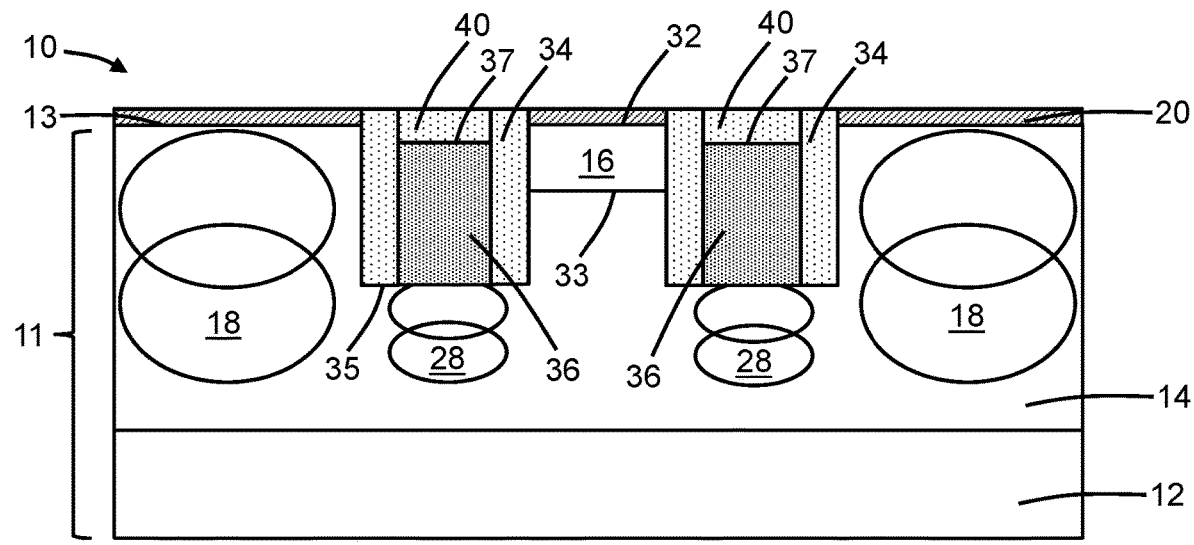

With reference to FIG. 6 in which like reference numerals refer to like features in FIG. 5 and at a subsequent fabrication stage, the conductor layers 36 may be recessed relative to the top surface 13 of the semiconductor substrate 11, and dielectric layers 40 may be formed as caps inside the trenches 22, 23 on the recessed conductor layers 36. The top surfaces 37 of the recessed conductor layers 36 may be positioned inside the trenches 22, 23 between the upper boundary 32 of the doped region 16 and the lower boundary 33 of the doped region 16. In an embodiment, the conductor layers 36 may be etched back by an etching process, and the dielectric layers 40 may be formed by depositing a layer of a dielectric material, such as silicon dioxide, that is an electrical insulator and planarizing the deposited layer such that the dielectric layers 40 are coplanar or substantially planar with the top surface 13 of the semiconductor substrate 11. In an alternative embodiment, an upper portion of each of the conductor layers 36 may be oxidized to form the dielectric layers 40.

The top surfaces 37 of the conductor layers 36 are positioned between the upper boundary 32 of the doped region 16, which may coincide with the top surface 13 of the semiconductor substrate 11, and the lower boundary 33 of the doped region 16, which is spaced from the upper boundary 32. The conductor layers 36 and dielectric layers 40 may participate, along with the doped regions 28, in defining gate structures of the junction field-effect transistor.

Figure 7:
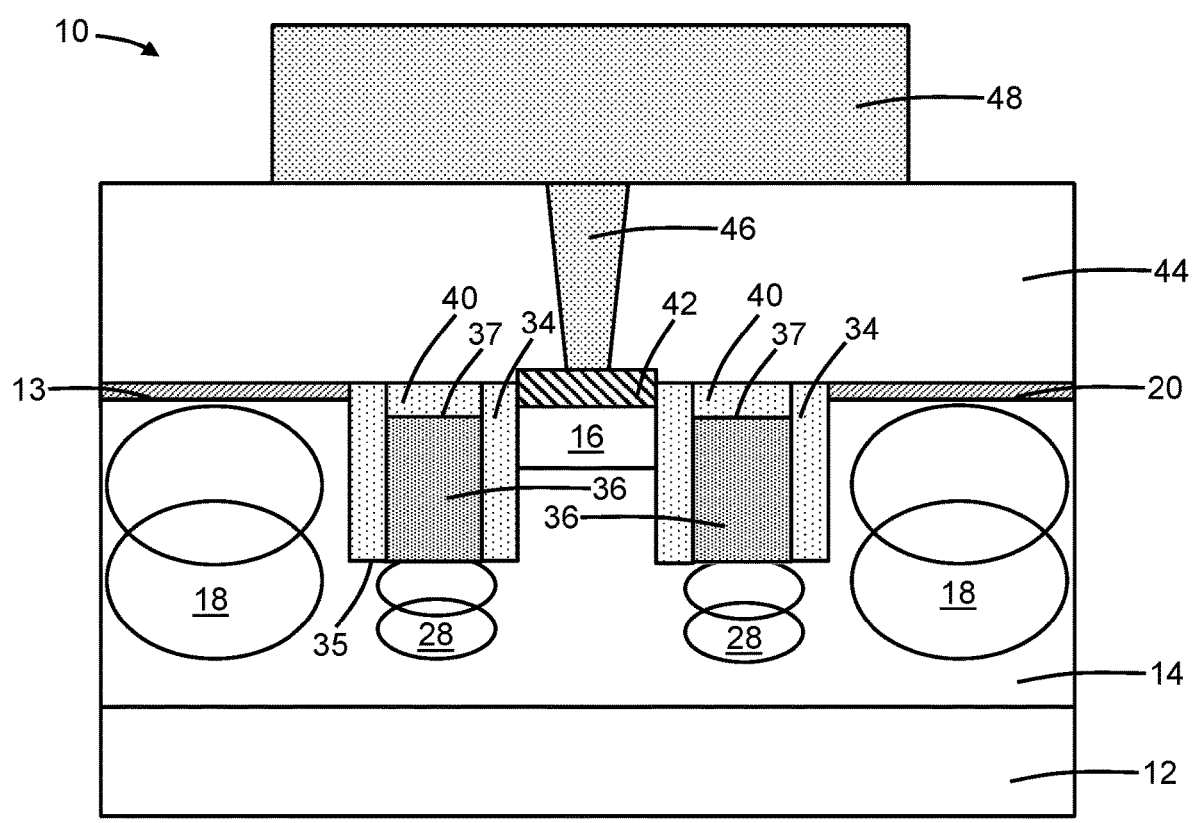

With reference to FIG. 7 in which like reference numerals refer to like features in FIG. 6 and at a subsequent fabrication stage, a silicide layer 42 may be formed on the top surface 13 of the semiconductor substrate 11 over the doped region 16. The silicide layer 42 may be formed by a self-aligned silicidation process that involves depositing a silicide-forming metal, removing the silicide-forming metal from the top surface 13 of the semiconductor substrate 11 over the doped regions 18, and performing one or more annealing steps to form a silicide phase by reacting the silicide-forming metal with the semiconductor layer 14. The layer 20, if present, may be removed from the top surface 13 of the semiconductor substrate 11 over the doped region 16 before depositing the silicide-forming metal. An initial annealing step of the silicidation process may consume the silicide-forming metal to form the silicide layer 42 on the top surface 13 of the semiconductor substrate 11 over the doped region 16. Following the initial annealing step, any non-reacted silicide-forming metal may be removed by wet chemical etching. The silicide layer 42 may then be subjected to an additional annealing step at a higher temperature to form a lower-resistance silicide phase. In an embodiment, the silicide-forming metal may be comprised of nickel.

A dielectric layer 44 is deposited and a contact 46 is formed in the dielectric layer 44. A metal feature 48 may be formed that is physically and electrically connected by the contact 46 and the silicide layer 42 to the doped region 16. The dielectric layer 44 may be comprised of a dielectric material, such as silicon dioxide, the contact 46 may be comprised of a metal, such as tungsten, and the metal feature 48 may be comprised of a metal, such as copper or aluminum. In alternative embodiments, a more complex interconnection may be formed coupling the metal feature 48 to the doped region 16.

The junction field-effect transistor has a vertical architecture in which the bulk substrate 12 provides a drain and the doped region 16 provides a source. The junction field-effect transistor is characterized by gate structures with conductor layers 36 that are located in trenches 22, 23 and that are recessed within the trenches 22, 23 to provide a substantially-planar arrangement with the doped region 16 of the source. The junction field-effect transistor may be formed with a small cell pitch, while also minimizing the specific resistance. The junction field-effect transistor may be characterized by a low gate series resistance, which may improve switching performance. The incorporation of the dielectric spacers 34, which separate and electrically isolate the doped region 16 from the conductor layers 36, may enhance the source-to-gate breakdown voltage.

Figure 8:
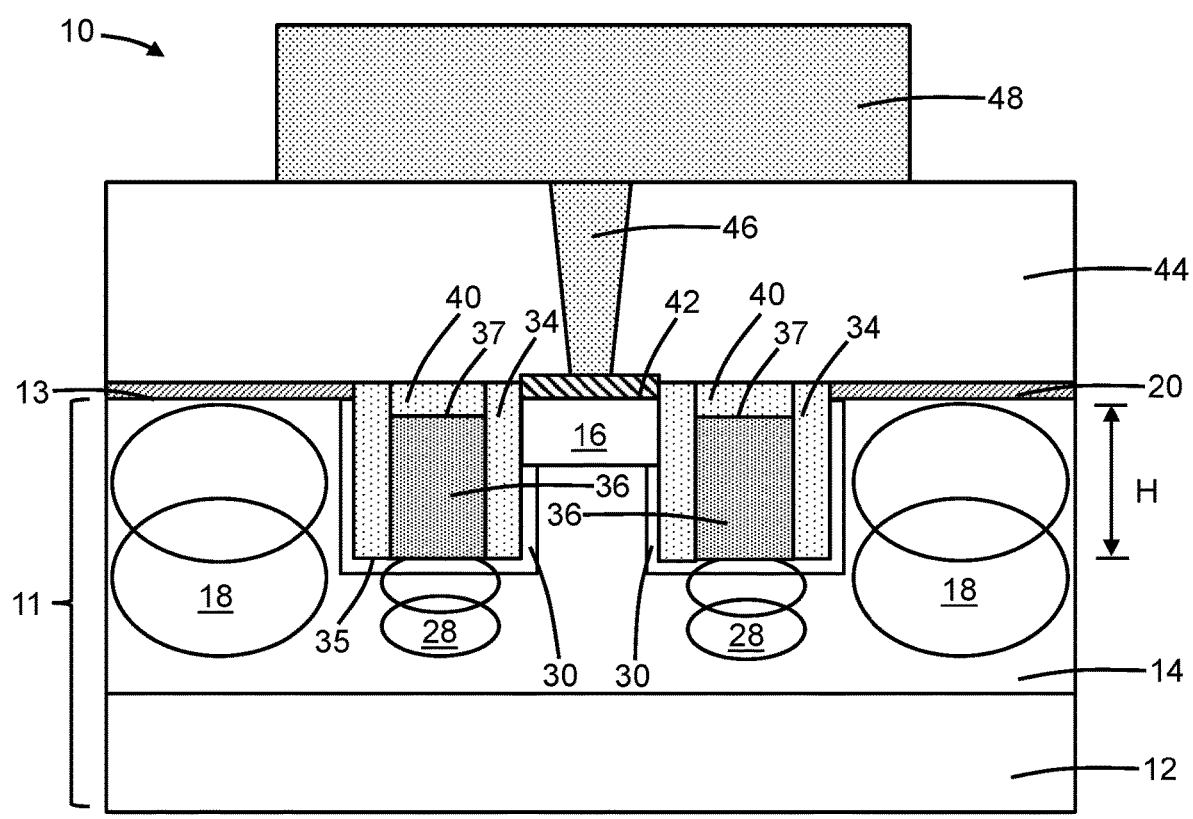
FIG. 8 is a cross-sectional view of a structure in accordance with alternative embodiments of the invention.

With reference to FIG. 8 and in accordance with alternative embodiments, doped regions 30 may be formed in the semiconductor layer 14 that are respectively adjacent to the sidewalls 24, 26 and bottoms 35 of the trenches 22, 23 and that frame the trenches 22, 23. In an embodiment, the doped regions 30 may respectively overlap with the sidewalls 24, 26 and bottoms 35 of the trenches 22, 23. In an embodiment, the doped regions 30 may extend in a vertical direction along the sidewalls 24, 26 of the trenches 22, 23. In an embodiment, the doped regions 30 may extend in a vertical direction along a full height H of the sidewalls 24, 26 of the trenches 22, 23. In an embodiment, the doped regions 30 may overlap with the doped regions 28 at the bottoms 35 of the trenches 22, 23.

The doped regions 30 may be formed by introducing a dopant of a given conductivity type by, for example, ion implantation into the semiconductor layer 14 with masking provided by the same patterned implantation mask used to form the doped region 28. The implantation conditions (e.g., ion species, dose, kinetic energy, substrate temperature, tilt angle and rotation) may be selected to tune the electrical and physical characteristics of the doped regions 30. In an embodiment, the doped regions 30 may be doped with a concentration of a p-type dopant (e.g., aluminum) to provide p-type electrical conductivity. In an embodiment, the doped regions 30 may be doped with a lower concentration of the p-type dopant than the doped regions 28. The doped regions 30 may define additional portions of the gate structure of the junction field-effect transistor.

Figure 9:
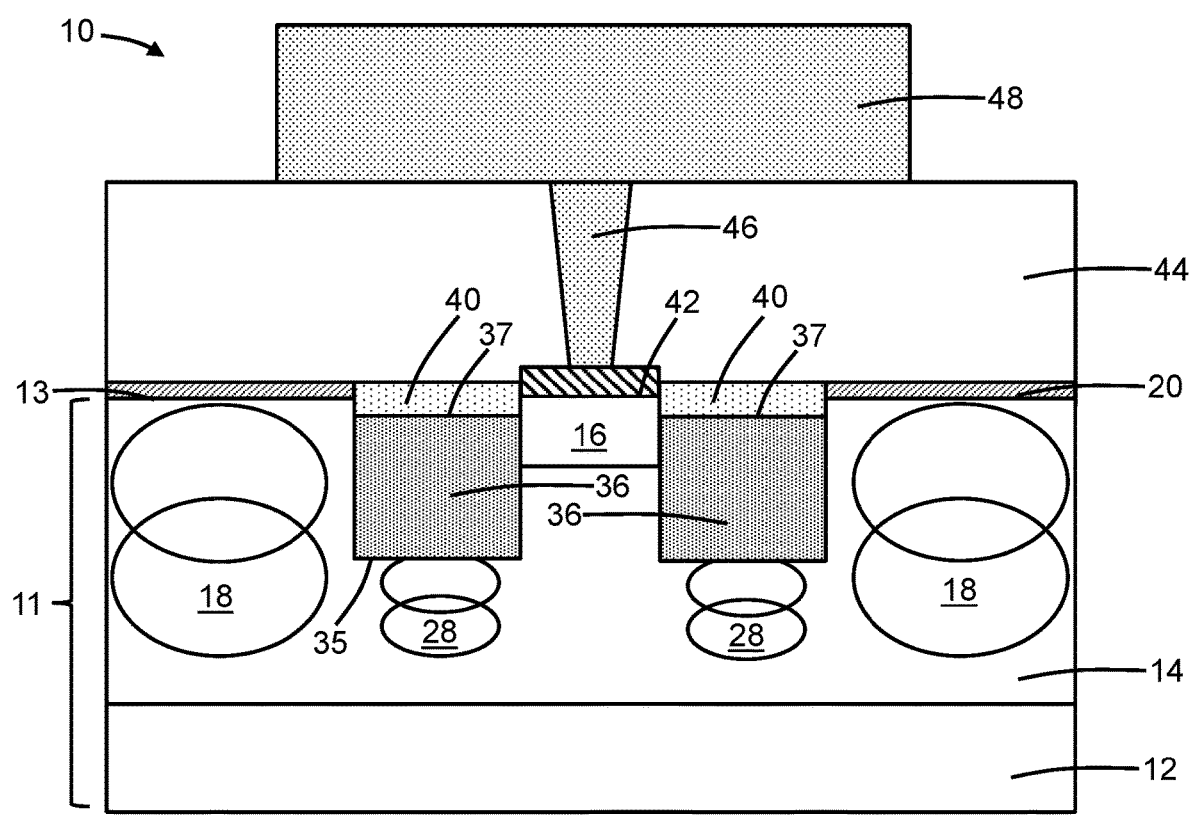
FIG. 9 is a cross-sectional view of a structure in accordance with alternative embodiments of the invention.

With reference to FIG. 9 and in accordance with alternative embodiments, the dielectric spacers 34 may be omitted from the device construction such that the sidewalls 24, 26 of the trenches 22, 23 are not covered when the conductor layers 36 are formed inside the trenches 22, 23. The conductor layers 36 may directly contact the semiconductor layer 14 at the sidewalls 24, 26 in the absence of the dielectric spacers 34.

Figure 10:
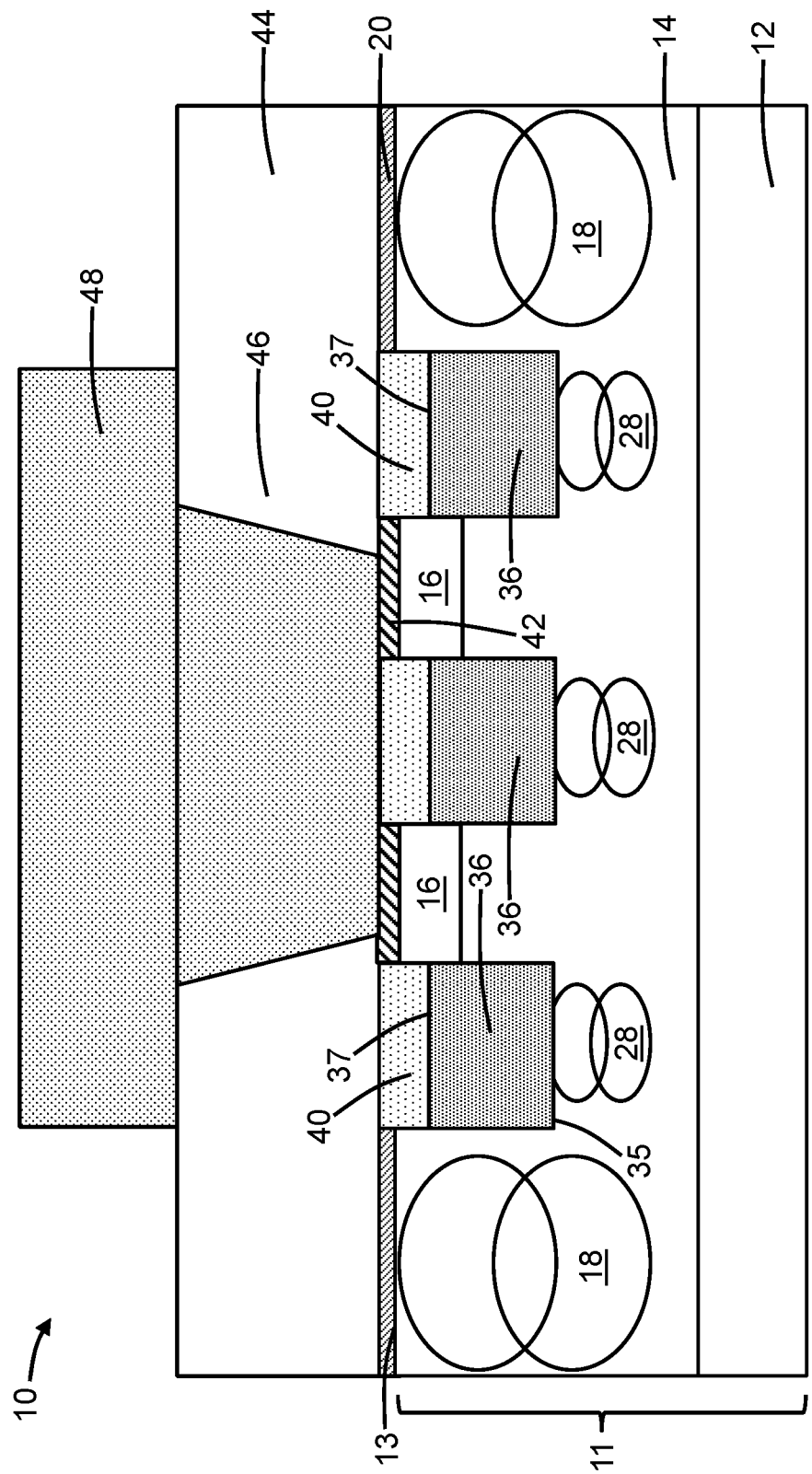
FIG. 10 is a cross-sectional view of a structure in accordance with alternative embodiments of the invention.

With reference to FIG. 10 and in accordance with alternative embodiments, the structure 10 may be modified to increase the number of doped regions 16 included in the source and to increase the number of gate structures. In an embodiment, the contact 46 may be physically and electrically connected by the silicide layers 42 to all of the doped regions 16. The contact 46 may be formed with self-alignment to the doped regions 16 in the absence of strict dimension control and without shorting to the conductor layers 36 of the gate structures. Because the top surfaces 37 of the conductor layers 36 are recessed below the top surface of the semiconductor layer 14 and therefore below the top surface of the doped regions 16 to provide an elevation difference, the contact 46 may be physically and electrically connected to the doped regions 16 without physically contacting the conductor layers 36. In that regard, the dielectric layers 40 are positioned between the contact 46 and the conductor layers 36 to prevent physical contact between the contact 46 and the conductor layers 36 and to electrically isolate the contact 46 from the conductor layers 36.

Figure 11:
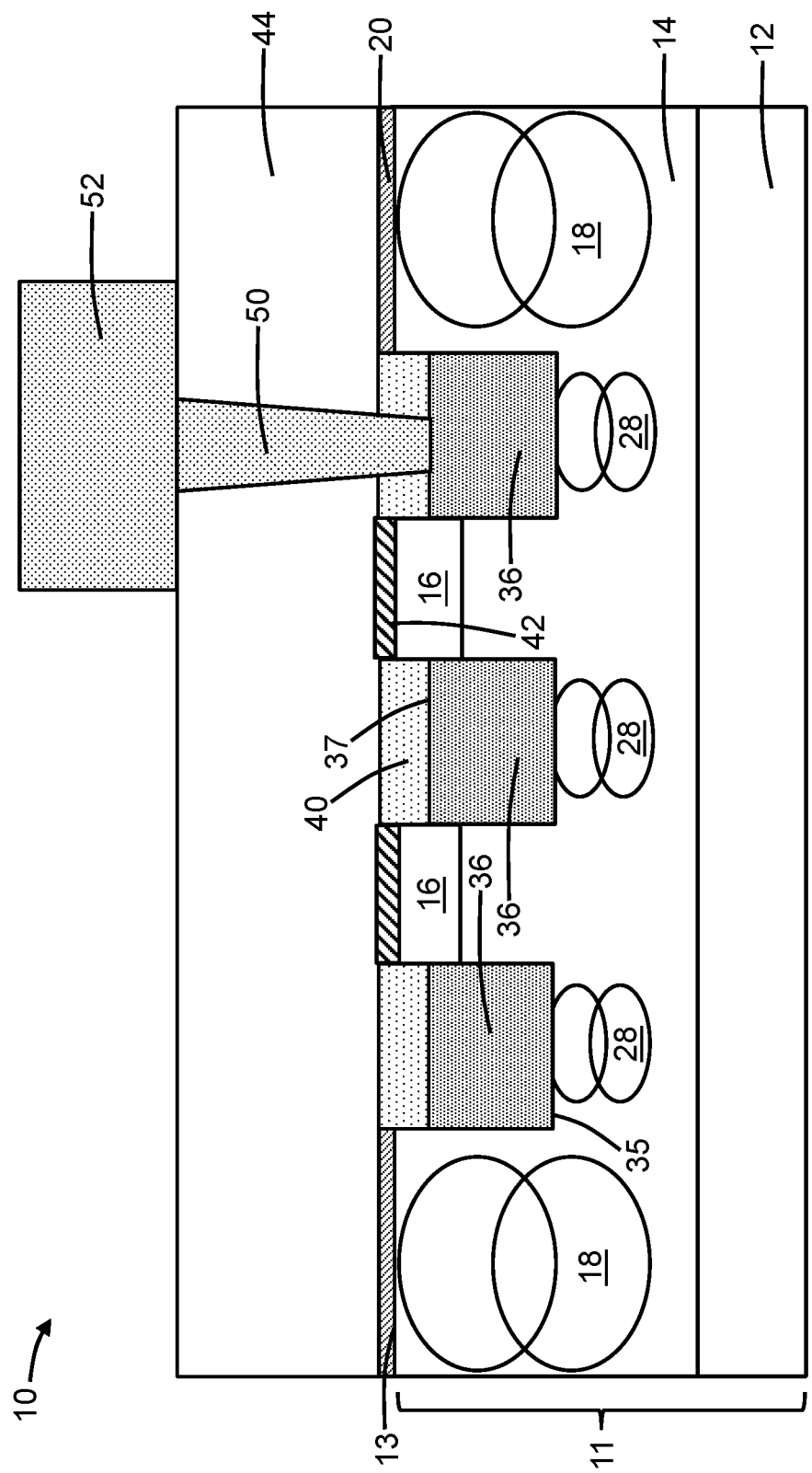
FIG. 11 is a cross-sectional view of a structure in accordance with alternative embodiments of the invention.

With reference to FIG. 11 and in accordance with alternative embodiments, contacts 50 may be formed in the dielectric layer 44 that are physically and electrically connected to the conductor layers 36. A metal feature 52 may be formed that surrounds the perimeter of the active area including the doped region 16 of the source and that is coupled by the contacts 50 to the conductor layers 36. The metal feature 52 may define a bus bar that is connected by the contacts 50 to all of the conductor layers 36 and that is connected to a gate pad.

Figure 12:
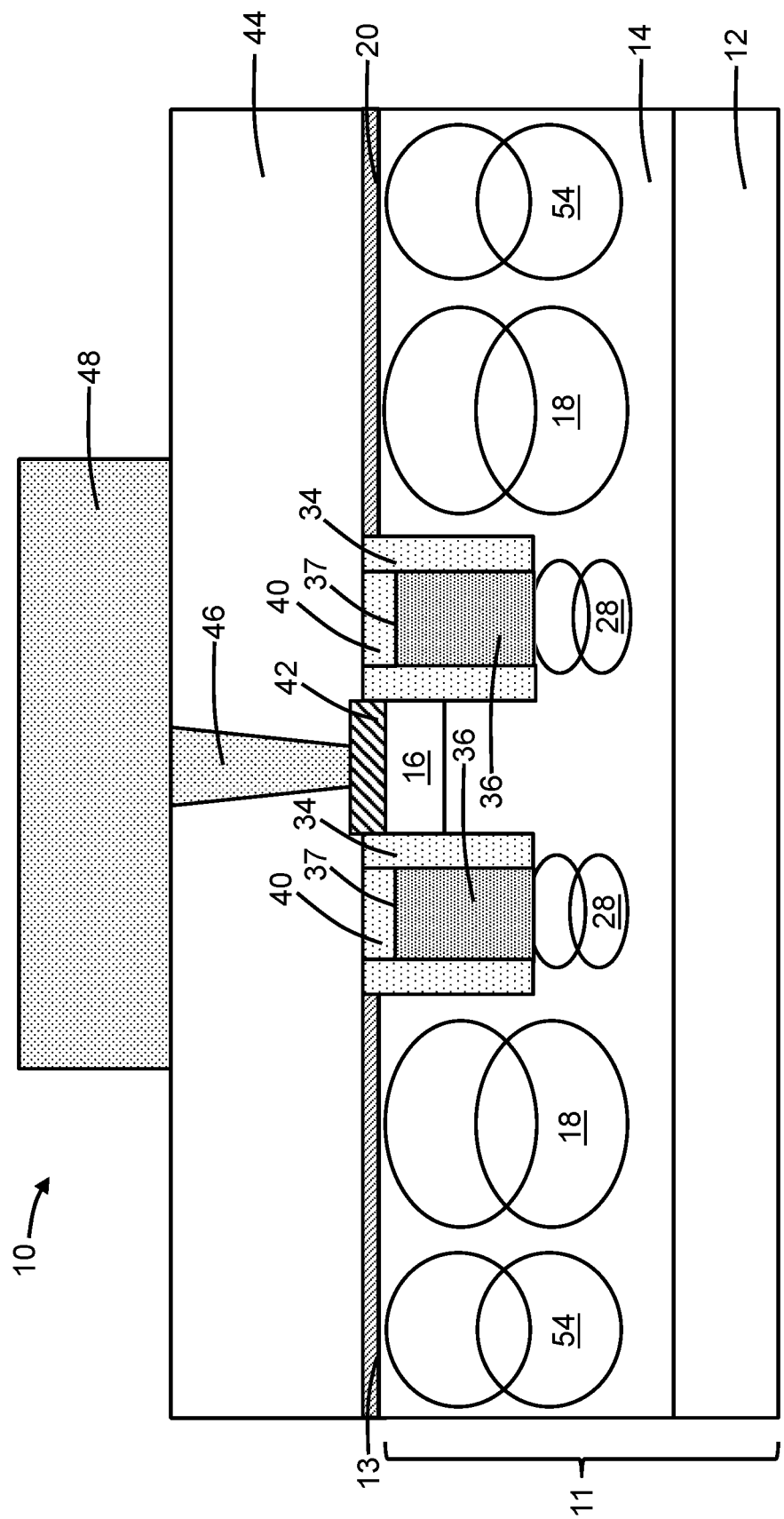
FIG. 12 is a cross-sectional view of a structure in accordance with alternative embodiments of the invention.

With reference to FIG. 12 and in accordance with alternative embodiments, sets of doped regions 54 may be positioned in the semiconductor layer 14 to define a guard ring that surrounds the active area including the junction field-effect transistor. The doped regions 54, which are electrically floating, are spaced in a lateral direction from the doped regions 18 with the doped regions 18 laterally between the doped region 16 and the doped regions 54. The doped regions 54 may have the same conductivity type (e.g., p-type) as the doped regions 18 and an opposite conductivity type from the semiconductor layer 14.

Figure 13:
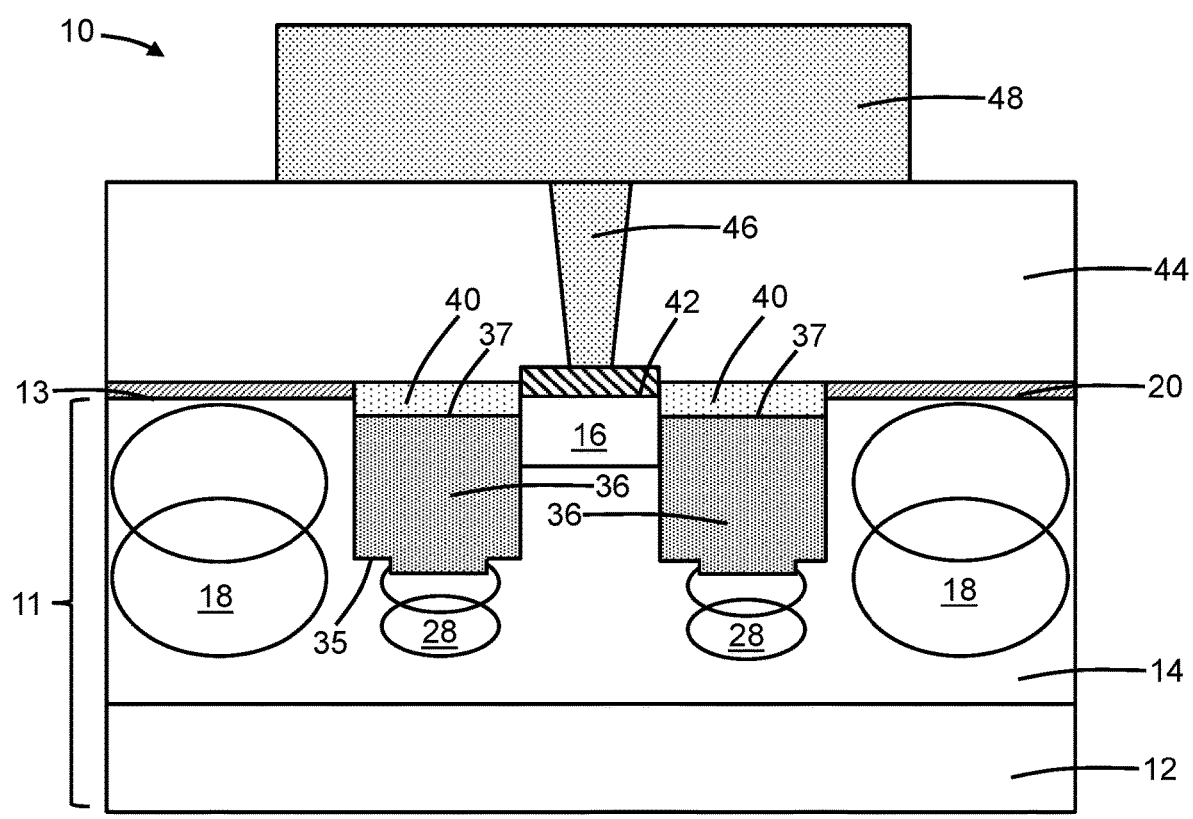
FIG. 13 is a cross-sectional view of a structure in accordance with alternative embodiments of the invention.

With reference to FIG. 13 and in accordance with alternative embodiments, a central portion of the trench bottom 35 of the trench 22 between the temporary spacers 27 (FIG. 3) may be extended in depth by an etching process to penetrate into at least one of the doped regions 28. The conductor layer 36 formed in the trench 22 includes a finger that projects downwardly into the extended portion of the trench 22 and away from the dielectric layer 40. Similarly, a central portion of the trench bottom 35 of the trench 23 between the temporary spacers 27 (FIG. 3) may be extended in depth by an etching process to penetrate into at least one of the doped regions 28. The conductor layer 36 formed in the trench 23 includes a finger that projects downwardly into the extended portion of the trench 23 and away from the dielectric layer 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a junction field-effect transistor, the structure comprising:
   a semiconductor substrate including a bulk substrate, a semiconductor layer on the bulk substrate, and a first trench in the semiconductor layer, the semiconductor substrate having a first surface, the bulk substrate and the semiconductor layer comprising a wide bandgap semiconductor material having a first conductivity type;
   a source including a first doped region in the semiconductor layer adjacent to the first trench, the first doped region having the first conductivity type, and the first doped region having a first boundary adjacent to the first surface of the semiconductor substrate and a second boundary spaced in depth from the first boundary;

a first gate structure including a first conductor layer inside the first trench and a first dielectric layer inside the first trench, the first conductor layer having a second surface positioned between the first boundary of the first doped region and the second boundary of the first doped region, and the first dielectric layer positioned on the second surface of the first conductor layer; and a first junction termination extension including a plurality of doped regions in the semiconductor layer adjacent to the first trench, the plurality of doped regions of the first junction termination extension having a second conductivity type opposite from the first conductivity type, wherein the first trench is positioned in a lateral direction between the first doped region of the source and the plurality of doped regions of the first junction termination extension, and the plurality of doped regions of the first junction termination extension have a width dimension that alternates between a maximum width and a minimum width with increasing depth in the semiconductor layer below the first surface.

2. The structure of claim 1 wherein the first trench has a trench bottom, the first gate structure further includes a plurality of second doped regions in the semiconductor layer beneath the trench bottom of the first trench, the plurality of second doped regions of the first gate structure have the second conductivity type.

3. The structure of claim 2 wherein the plurality of second doped regions of the first gate structure are stacked and partially overlap to provide a width dimension that varies with depth relative to the trench bottom of the first trench between a maximum width and a minimum width.

4. The structure of claim 2 wherein the first trench includes a portion in at least one of the plurality of second doped regions of the first gate structure, and the first conductor layer includes a finger that extends into the portion of the first trench.

5. The structure of claim 1 further comprising:
a second dielectric layer over the semiconductor substrate; and
a first contact in the second dielectric layer, the first contact connected to the first doped region of the source, and the first contact extending in the lateral direction over the first dielectric layer.

6. The structure of claim 5 wherein the source includes a second doped region in the semiconductor substrate adjacent to the first trench, the first trench is positioned in the lateral direction between the first doped region of the source and the second doped region of the source, the second doped region of the source has the first conductivity type, and the first contact is connected to the second doped region of the source.

7. The structure of claim 6 wherein the first dielectric layer is positioned in the lateral direction between the first doped region of the source and the second doped region of the source, and the first contact overlaps with the first dielectric layer.

8. The structure of claim 5 further comprising:
a second contact in the second dielectric layer, the second contact connected to the first conductor layer of the first gate structure.

9. The structure of claim 1 further comprising:
a dielectric spacer inside the first trench, the dielectric spacer positioned between the first conductor layer and the first doped region of the first gate structure.

10. The structure of claim 1 wherein the first trench has a sidewall, the first gate structure further includes a second doped region extending along the sidewall of the first trench, and the second doped region of the first gate structure has the second conductivity type.

11. The structure of claim 10 wherein the second doped region of the first gate structure extends along a full height of the sidewall of the first trench.

12. The structure of claim 11 further comprising:
a dielectric spacer inside the first trench,
wherein the dielectric spacer positioned between the first conductor layer and the second doped region of the first gate structure.

13. The structure of claim 1 wherein the first trench includes a sidewall, and the first conductor layer is in direct contact with the semiconductor layer at the sidewall of the first trench.

14. The structure of claim 1 further comprising:
a layer on the first surface of the semiconductor substrate over the plurality of doped regions of the first junction termination extension, the layer comprising aluminum nitride.

15. The structure of claim 1 wherein the semiconductor substrate includes a second trench, the first doped region of the source is positioned in the lateral direction between the first trench and the second trench, and further comprising:
a second gate structure including a second conductor layer inside the second trench and a second dielectric layer inside the second trench, the second conductor layer having a third surface positioned between the first boundary of the first doped region and the second boundary of the first doped region, and the second dielectric layer positioned on the third surface of the second conductor layer.

16. The structure of claim 1 wherein the bulk substrate has a higher dopant concentration than the semiconductor layer, the first trench penetrates from the first surface partially through the semiconductor layer, the first doped region of the source is positioned in the semiconductor layer, and the first doped region of the source has a higher dopant concentration than the semiconductor layer.

17. A method of forming a structure for a junction field-effect transistor, the method comprising:
forming a trench in a semiconductor layer of a semiconductor substrate, wherein the semiconductor substrate has a first surface, the semiconductor layer is positioned on a bulk substrate, and the bulk substrate and the semiconductor layer comprise a wide bandgap semiconductor material having a first conductivity type;

forming a doped region of a source in the semiconductor substrate adjacent to the trench, wherein the doped region has the first conductivity type, and the doped region has a first boundary adjacent to the first surface of the semiconductor substrate and a second boundary spaced in depth from the first boundary;

forming a gate structure including a conductor layer inside the trench and a dielectric layer inside the trench, wherein the conductor layer has a second surface positioned between the first boundary of the doped region and the second boundary of the doped region, and the dielectric layer is positioned on the second surface of the conductor layer; and forming a junction termination extension including a plurality of doped regions in the semiconductor layer adjacent to the trench, wherein the plurality of doped regions of the junction termination extension have a second conductivity type opposite from the first conductivity type, the trench is positioned in a lateral direction between the doped region of the source and the plurality of doped regions of the junction termination extension, and the plurality of doped regions of the junction termination extension have a width dimension that alternates between a maximum width and a minimum width with increasing depth in the semiconductor layer below the first surface.

18. The structure of claim 1 wherein the semiconductor layer includes a second trench, and further comprising:
a second junction termination extension including a plurality of doped regions in the semiconductor layer adjacent to the second trench, the plurality of doped regions of the second junction termination extension having the second conductivity type
wherein the second trench is positioned in the lateral direction between the first doped region of the source and the plurality of doped regions of the second junction termination extension.

19. The structure of claim 18 wherein the first doped region of the source is positioned in the lateral direction between the first trench and the second trench, and further comprising:
a second gate structure including a second conductor layer inside the second trench and a second dielectric layer inside the second trench.

* * * * *